(12) United States Patent
Nagahisa et al.

(10) Patent No.: US 9,923,546 B2
(45) Date of Patent: Mar. 20, 2018

(54) HIGH-PASS FILTER CIRCUIT AND BAND-PASS FILTER CIRCUIT

(71) Applicants: Takeshi Nagahisa, Osaka (JP); Yasukazu Nakatani, Hyogo (JP)

(72) Inventors: Takeshi Nagahisa, Osaka (JP); Yasukazu Nakatani, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/604,851

(22) Filed: Jan. 26, 2015

(65) Prior Publication Data

US 2015/0229293 A1    Aug. 13, 2015

(30) Foreign Application Priority Data

Feb. 7, 2014    (JP) ................. 2014-022584

(51) Int. Cl.
*H03K 5/00*    (2006.01)
*H03H 11/12*    (2006.01)
(Continued)

(52) U.S. Cl.
CPC .......... *H03H 11/1278* (2013.01); *H03H 7/06* (2013.01); *H03H 11/1204* (2013.01); *H03H 11/126* (2013.01); *H03H 11/245* (2013.01)

(58) Field of Classification Search
CPC .. H03H 11/1278; H03H 7/06; H03H 11/1204; H03H 11/126
(Continued)

(56) References Cited

U.S. PATENT DOCUMENTS

| | | | |
|---|---|---|---|
| 4,994,774 A * | 2/1991 | Joosse | H03H 11/46 327/558 |
| 5,736,852 A * | 4/1998 | Pattantyus | G01P 3/481 324/166 |

(Continued)

FOREIGN PATENT DOCUMENTS

| | | |
|---|---|---|
| EP | 0329245 A1 | 8/1989 |
| JP | S53-145453 | 12/1978 |

(Continued)

OTHER PUBLICATIONS

Jun. 9, 2015 European official action dated in corresponding European Patent Application No. 15153095.3.
(Continued)

*Primary Examiner* — Dinh T Le
(74) *Attorney, Agent, or Firm* — Cooper & Dunham LLP (57) ABSTRACT

Two types of high-pass filter circuit and a band-pass filter circuit are provided. Both types of high-pass filter circuit include a capacitor configured to input an input signal, a resistor connected between an output terminal of the capacitor and a prescribed bias voltage, and a signal output circuit connected to the output terminal of the capacitor and configured to buffer-amplify the input signal for output. In one of the two types of high-pass filter circuits, the resistor is formed on an SOI semiconductor substrate and includes two PN junction diodes that are inversely connected to each other in parallel. In the other one of the high-pass filter circuits, the resistor is formed on an SOI semiconductor substrate and includes two MOS transistors that are inversely connected to each other in parallel.

8 Claims, 4 Drawing Sheets

(51) Int. Cl.
*H03H 7/06* (2006.01)
*H03H 11/24* (2006.01)

(58) Field of Classification Search
USPC .................................................. 327/551–559
See application file for complete search history.

(56) References Cited

U.S. PATENT DOCUMENTS

| | | | |
|---|---|---|---|
| 5,808,979 A * | 9/1998 | Ishibashi | G11B 7/0941 369/124.13 |
| 6,340,913 B1 * | 1/2002 | Grundy | H03H 11/04 327/552 |
| 6,882,216 B2 * | 4/2005 | Kang | H03H 11/04 327/552 |
| 6,995,606 B2 * | 2/2006 | Bilotti | H03H 11/04 327/552 |
| 7,355,631 B2 * | 4/2008 | Kumaki | G01C 19/5776 348/208.99 |
| 7,397,226 B1 | 7/2008 | Mannama et al. | |
| 7,872,534 B2 * | 1/2011 | Dobashi | H04N 5/148 330/306 |
| 8,368,461 B2 * | 2/2013 | Blanc | H03H 11/04 327/552 |
| 8,461,651 B2 * | 6/2013 | Huang | H01L 21/84 257/350 |
| 8,975,947 B1 * | 3/2015 | Seshita | H03K 17/162 327/379 |
| 9,315,017 B2 * | 4/2016 | Fukazawa | B41J 2/0451 |
| 9,329,610 B2 * | 5/2016 | David | H02M 3/07 |
| 2003/0151865 A1 * | 8/2003 | Maio | H01L 27/0266 361/52 |
| 2005/0002429 A1 | 1/2005 | Nakatani | |
| 2005/0141395 A1 | 6/2005 | Nakatani | |
| 2009/0010301 A1 | 1/2009 | Nagahisa | |
| 2011/0012582 A1 | 1/2011 | Aisu | |
| 2011/0095813 A1 | 4/2011 | Ozasa et al. | |
| 2013/0284931 A1 | 10/2013 | Nagahisa et al. | |
| 2014/0077872 A1 | 3/2014 | Nagahisa | |
| 2014/0312967 A1 | 10/2014 | Nagahisa | |

FOREIGN PATENT DOCUMENTS

| | | |
|---|---|---|
| JP | 57-108670 | 7/1982 |
| JP | H01-265607 | 10/1989 |
| JP | 2010-021435 | 1/2010 |
| JP | 2011-022689 | 2/2011 |

OTHER PUBLICATIONS

Y. Choi et al: "A bufferless Interface for Single-Ended ECM Sensors", IEEE Transactions on Instrumentation and Measurement, vol. 61, No. 2, Feb. 1, 2012, pp. 513-520, XP011391158.

T. Komensky et al: "Ultra-wearable capacitive coupled and common electrode-Free ECG monitoring system", The Effect of Applied Compressive Loading on Tissue-Engineered Cartilage Constructs Cultured With TGF-BETA3, IEEE, Aug. 28, 2012, pp. 1594-1597, XP032463232.

M. Saukoski: "System and circuit design for a capacitive MEMS gyroscope", Jan. 1, 2008, XP055082461.

D. Kim et al: "Low-Power Low-Noise Neural Amplifier in 0.18um FD-SOI Technology", Circuits and Systems, 2007. ISCAS 2007. IEEE International Symposium o n, IEEE, PI, May 27, 2007, pp. 805-805 XP031668876.

Razavi, B. (1981). Design of Analog CMOS Integrated Circuits, McGraw-Hill, p. 32.

Japanese official action dated Dec. 5, 2017 in connection with corresponding Japanese Patent Application No. 2014-022584.

* cited by examiner

HIGH-PASS FILTER CIRCUIT AND BAND-PASS FILTER CIRCUIT

CROSS-REFERENCE TO RELATED APPLICATION

This patent application is based on and claims priority pursuant to 35 U.S.C. § 119(a) to Japanese Patent Application No. 2014-022584, filed on Feb. 7, 2014, in the Japan Patent Office, the entire disclosure of which is hereby incorporated by reference herein.

BACKGROUND

Technical Field

Example embodiments generally relate to a high-pass filter circuit and a band-pass filter circuit.

Background Art

In recent years, for the purpose of adding energy-saving or other convenient functions to household electrical appliances, the development of various kinds of sensors integrated into a semiconductor integrated circuit such as an infrared sensor, an image sensor, and a temperature sensor is actively carried out. As signals output from some of these sensors are minute and at low velocity, the amplitude of these signals needs to be amplified by an amplifier circuit in a subsequent stage. However, if the signals including direct-current components are amplified, the direct-current components are also amplified and the alternating-current signal components are not sufficiently amplified. For this reason, it is desired that the output signals from a sensor be amplified upon passing through a high-pass filter circuit.

SUMMARY

Embodiments of the present invention described herein provide two types of high-pass filter circuit and a band-pass filter circuit. Both types of high-pass filter circuit includes a capacitor configured to input an input signal, a resistor connected between an output terminal of the capacitor and a prescribed bias voltage, and a signal output circuit connected to the output terminal of the capacitor and configured to buffer-amplify the input signal for output. In one of the high-pass filter circuits, the resistor is formed on an SOI semiconductor substrate and includes two PN junction diodes that are inversely connected to each other in parallel, and the two PN junction diodes have an approximately zero potential difference between an anode and cathode of the PN junction diodes. In the other one of the high-pass filter circuits, the resistor is formed on an SOI semiconductor substrate and includes two MOS transistors that are inversely connected to each other in parallel, and the two MOS transistors operate within a cutoff range. The band-pass filter circuit includes a first high-pass filter circuit and a second high-pass filter circuit, and a signal output circuit configured to generate and output a differential signal between a signal output from the first high-pass filter circuit and a signal output from the second high-pass filter circuit, where the second high-pass filter circuit has a frequency characteristic different from that of the first high-pass filter circuit

BRIEF DESCRIPTION OF THE SEVERAL VIEWS OF THE DRAWINGS

A more complete appreciation of exemplary embodiments and the many attendant advantages thereof will be readily obtained as the same becomes better understood by reference to the following detailed description when considered in connection with the accompanying drawings.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Example embodiments of the present invention are described below with reference to the drawings. In the example embodiments described below, like reference signs are given to similar elements.

The example embodiments of the present invention relate to a high-pass filter circuit with low cutoff frequency and a band-pass filter circuit using such a high-pass filter circuit with low cutoff frequency. When PN junction is formed on a silicon on insulator (SOI) substrate, a diffused layer and the substrate are electrically insulated by an insulating layer.

Accordingly, compared with a bulk substrate on which PN junction or the like is formed, the area of the junction between the substrate and anode and cathode electrodes is small, and the electric current flowing through the substrate is reduced. This configuration may be applied to achieve nonlinear resistance having a resistance value higher than that of a control sample. The cutoff frequency f of a high-pass filter including an L-form circuit with a capacitor C and a resistance R is expressed in the following equation.

$$f = \frac{1}{2\pi RC}$$

As apparent from the above equation, the cutoff frequency f may be decreased by increasing the resistance value of the resistance R. Example embodiments of the present invention are described below in detail with reference to the drawings.

First Embodiment

Figure 1:
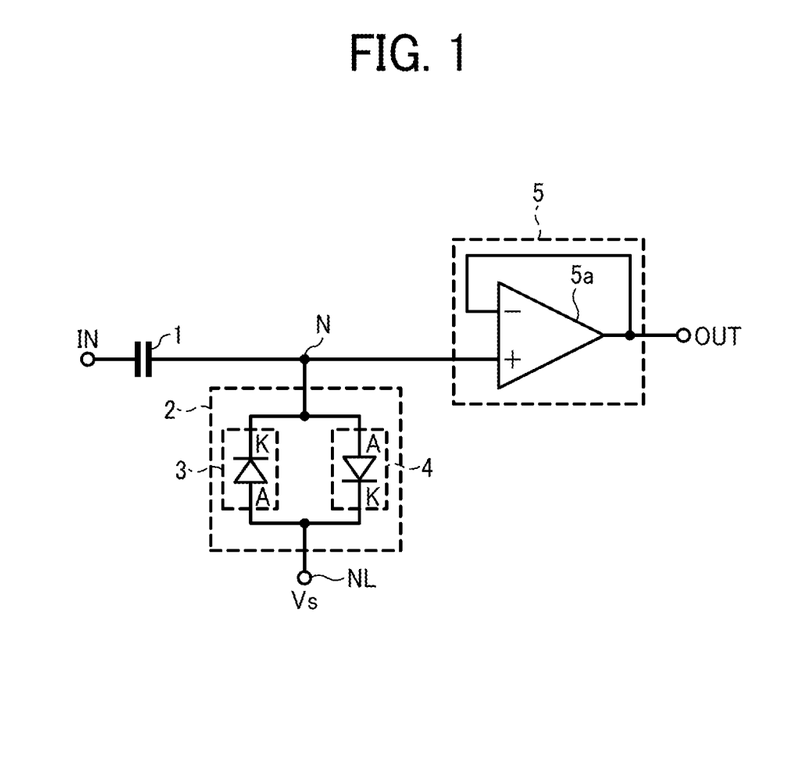
FIG. 1 illustrates the configuration of a high-pass filter circuit according to a first example embodiment of the present invention.

FIG. 1 illustrates the configuration of a high-pass filter circuit according to a first example embodiment of the present invention. The high-pass filter circuit illustrated in FIG. 1 is a semiconductor integrated circuit formed on the SOI semiconductor substrate, and is provided with a capacitor 1, a resistor 2 including first and second PN junction diodes 3 and 4, and a signal output circuit 5 including an operational amplifier 5a.

In FIG. 1, an input signal is input through a signal input terminal IN, and the direct-current (DC) components of the input signal are filtered at the capacitor 1 and then the filtered input signal reaches the signal output circuit 5. The signal output circuit 5 configures a voltage follower circuit in which the output terminal and inverted input terminal of the operational amplifier 5a are connected to each other, and buffer-amplifies the signal input to the non-inverted input terminal at an amplification factor of, for example, "1" to output the buffer-amplified signal to a signal output terminal OUT. Note that the amplification factor is not limited to "1" but may be any number other than "0".

The first and second PN junction diodes 3 and 4 are formed on the SOI semiconductor substrate, and are inversely connected to each other in parallel. The cathode of the first PN junction diode 3 and the anode of the second PN junction diode 4 are connected to a node N connected to the capacitor 1 and the input terminal of the signal output circuit 5. The anode of the first PN junction diode 3 and the cathode of the second PN junction diode 4 are connected to a low-impedance node NL.

The first and second PN junction diodes 3 and 4 sets the direct-current (DC) bias point of the input terminal of the signal output circuit 5 to prescribed bias potential Vs using a constant-voltage generator. The first PN junction diode 3 passes an electric current from the low-impedance node NL to the node N, and the second PN junction diode 4 passes an electric current from the node N to the low-impedance node NL. These characteristics of the PN junction diodes 3 and 4 regarding voltage V and current I are expressed in the following equation (1).

$$I = I0(\exp(qV/nkT) - 1) \tag{1}$$

In the Equation (1), I0 is a value indicating a proportionality constant determined by the diffusion of semiconductor layer or the area of diode. Moreover, K, T, and q indicate a Boltzmann constant, absolute temperature, and the amount of electric charge of electron, respectively.

Accordingly, even when the amplitude of the input signal is very small, the potential difference between the anode and cathode of the first and second PN junction diodes 3 and 4 is a minute potential difference that is approximately zero (for example, a potential difference ranging from +10 mV to −10 mV), and minute electric current flows through the first and second PN junction diodes 3 and 4. Due to this configuration, the connection between the first and second PN junction diodes 3 and 4 in FIG. 1 configures the resistor 2, and the circuitry of FIG. 1 in which the capacitor 1 and the resistor 2 are combined implements a high-pass filter circuit.

Note that the potential difference between the anode and cathode of the two PN junction diodes that are inversely connected to each other and formed on a bulk semiconductor substrate is about 0.6 V. According to the high-pass filter circuit in the first example embodiment of the present invention, a high-pass filter circuit having very small cutoff frequency of 10 mHz is achieved.

According to the first example embodiment described above, the resistor 2 is configured by the first and second PN junction diodes 3 and 4 that are formed on an SOI semiconductor substrate, and the potential difference between the anode and cathode of the first and second PN junction diodes 3 and 4 is configured to be approximately zero. By using the high-pass filter circuit composed of the resistor 2 and the capacitor 1, for example, a high-pass filter circuit having very small cutoff frequency of 10 mHz is achieved.

Second Embodiment

Figure 2:
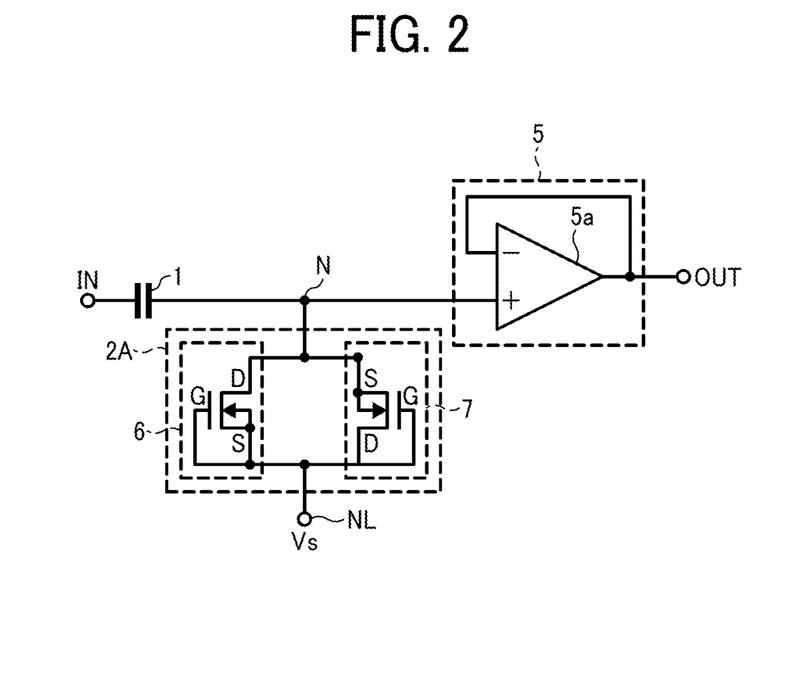
FIG. 2 illustrates the configuration of a high-pass filter circuit according to a second example embodiment of the present invention.

FIG. 2 illustrates the configuration of a high-pass filter circuit according to a second example embodiment of the present invention. The high-pass filter circuit according to the second example embodiment is different from the high-pass filter circuit of FIG. 1 according to the first example embodiment in the following points. Instead of the resistor 2, a resistor 2A including first and second metal oxide semiconductor (MOS) transistors 6 and 7 that are inversely connected to each other in parallel is provided. In other words, the first and second PN junction diodes 3 and 4 of FIG. 1 are replaced by the first and second MOS transistors 6 and 7 in the high-pass filter circuit according to the second example embodiment. Note that the first and second MOS transistors 6 and 7 are enhancement N-channel MOS transistors. Differences between high-pass filter circuit according to the second example embodiment and the high-pass filter circuit according to the first example embodiment are described below in detail.

In FIG. 2, the gate, source, and back gate of the first MOS transistor 6 are connected to the low-impedance node NL, and the drain of the first MOS transistor 6 is connected to the node N. Due to this configuration, the first MOS transistor 6 functions in a similar manner to the first PN junction diode 3 of FIG. 1. Moreover, the drain of the second MOS transistor 7 is connected to the low-impedance node NL, and the gate, source, and back gate of the second MOS transistor 7 are connected to the node N. Due to this configuration, the second MOS transistor 7 functions in a similar manner to the second PN junction diode 4 of FIG. 1. In a similar manner to the first example embodiment, the low-impedance node NL is set to prescribed bias potential Vs using a constant-voltage generator. In the present example embodiment, the gate and source of the first and second MOS transistors 6 and 7 are connected to each other. Accordingly, the gate-source voltage Vgs=0, and the first and second MOS transistors 6 and 7 operate within a cutoff range where the current at the drains of the first and second MOS transistors 6 and 7 is approximately zero.

Accordingly, even when the amplitude of the input signal is very small, the potential difference between the source and drain of the first and second MOS transistors 6 and 7 is a minute potential difference that is approximately zero (for example, a potential difference ranging from +10 mV to −10 mV), and minute electric current flows through the first and second MOS transistors 6 and 7. Due to this configuration, the connection between the first and second MOS transistors 6 and 7 in FIG. 2 configures the resistor 2A, and the circuitry of FIG. 2 in which the capacitor 1 and the resistor 2A are combined implements a high-pass filter circuit.

According to the second example embodiment described above, the resistor 2A is configured by the first and second MOS transistors 6 and 7 that are formed on an SOI semiconductor substrate, and the potential difference between the source and drain of the first and second MOS transistors 6 and 7 is configured to be approximately zero. By using the high-pass filter circuit composed of the resistor 2A and the capacitor 1, for example, a high-pass filter circuit having very small cutoff frequency of 10 mHz is achieved.

Third Embodiment

Figure 3:
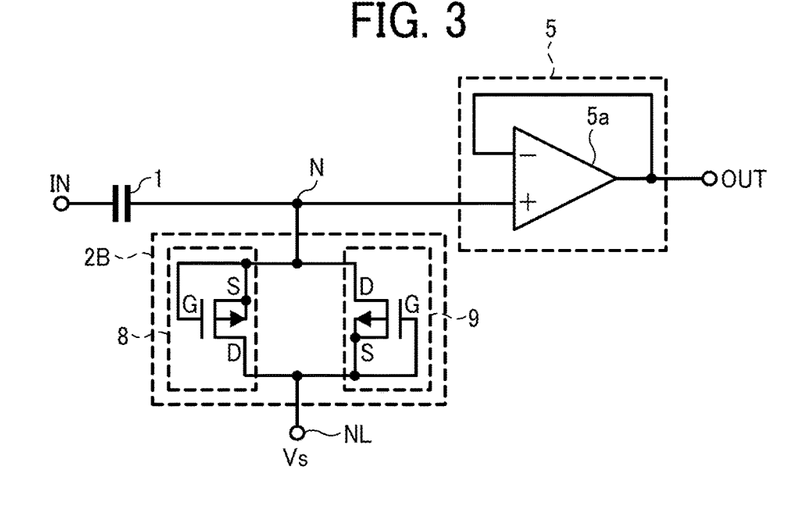
FIG. 3 illustrates the configuration of a high-pass filter circuit according to a third example embodiment of the present invention.

FIG. 3 illustrates the configuration of a high-pass filter circuit according to a third example embodiment of the present invention. The high-pass filter circuit according to the third example embodiment is different from the high-pass filter circuit of FIG. 1 according to the first example embodiment in the following points. Instead of the resistor 2, a resistor 2B including third and fourth MOS transistors 8 and 9 is provided. In other words, the first and second PN junction diodes 3 and 4 of FIG. 1 are replaced by the third and fourth MOS transistors 8 and 9 in the high-pass filter circuit according to the third example embodiment. Note that the third and fourth MOS transistors 8 and 9 are enhancement P-channel MOS transistors. Differences between high-pass filter circuit according to the second example embodiment and the high-pass filter circuit according to the first example embodiment are described below in detail.

In FIG. 3, the gate, source, and back gate of the third MOS transistor 8 are connected to the node N, and the drain of the third MOS transistor 8 is connected to the low-impedance node NL. Due to this configuration, the third MOS transistor 8 functions in a similar manner to the first PN junction diode 3 of FIG. 1. Moreover, the drain of the fourth MOS transistor 9 is connected to the node N, and the gate, source, and back gate of the fourth MOS transistor 9 are connected to the low-impedance node NL. Due to this configuration, the fourth MOS transistor 9 functions in a similar manner to the second PN junction diode 4 of FIG. 1. In a similar manner to the first example embodiment, the low-impedance node NL is set to prescribed bias potential Vs using a constant-voltage generator. In the present example embodiment, the gate and source of the third and fourth MOS transistors 8 and 9 are connected to each other. Accordingly, the gate-source voltage Vgs=0, and the third and fourth MOS transistors 8 and 9 operate within a cutoff range where the current at the drains of the third and fourth MOS transistors 8 and 9 is approximately zero.

Accordingly, even when the amplitude of the input signal is very small, the potential difference between the source and drain of the third and fourth MOS transistors 8 and 9 is a minute potential difference that is approximately zero (for example, a potential difference ranging from +10 mV to −10 mV), and minute electric current flows through the third and fourth MOS transistors 8 and 9. Due to this configuration, the connection between the third and fourth MOS transistors 8 and 9 in FIG. 3 configures the resistor 2B, and the circuitry of FIG. 3 in which the capacitor 1 and the resistor 2B are combined implements a high-pass filter circuit.

According to the third example embodiment described above, the resistor 2B is configured by the third and fourth MOS transistors 8 and 9 that are formed on an SOI semiconductor substrate, and the potential difference between the source and drain of the third and fourth MOS transistors 8 and 9 is configured to be approximately zero. By using the high-pass filter circuit composed of the resistor 2B and the capacitor 1, for example, a high-pass filter circuit having very small cutoff frequency of, for example, 10 mHz, is achieved.

<Control Sample>

Figure 4:
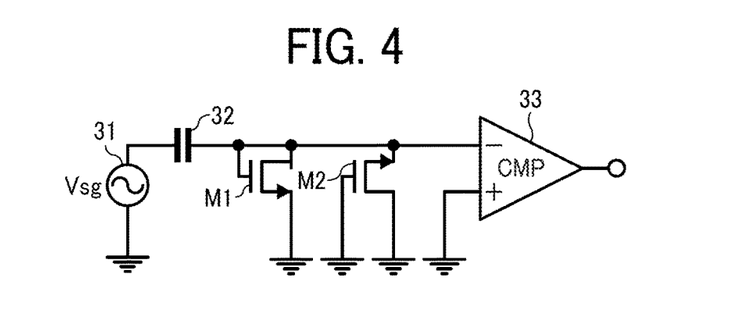
FIG. 4 illustrates the configuration of a known voltage comparator circuit according to a control sample in which MOS transistors M1 and M2 are used as resistors.

FIG. 4 illustrates the configuration of a known voltage comparator circuit according to a control sample in which MOS transistors are used as resistors. The voltage comparator circuit according to the present control sample includes a voltage comparator 33, MOS transistors M1 and M2, and a capacitor 32. The input signal of signal voltage Vsg from a signal source 31 is input to the voltage comparator circuit through the capacitor 32, and the MOS transistors M1 and M2 are used as resistors.

Figure 5:
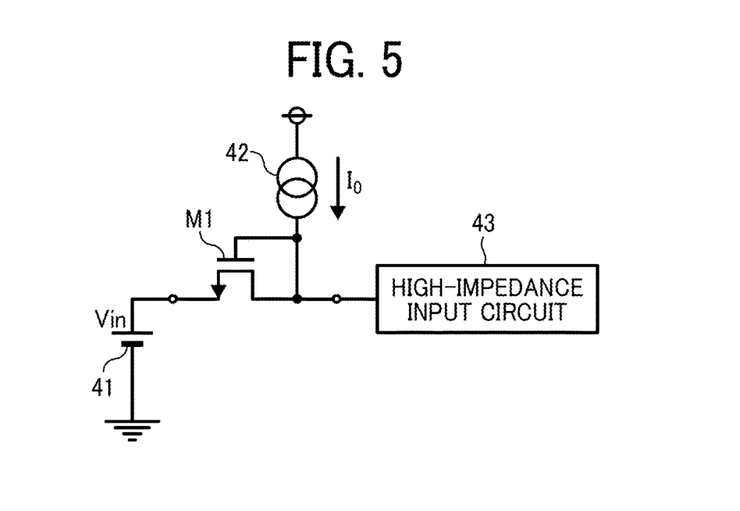
FIG. 5 illustrates the configuration of an equivalent circuit of the MOS transistor M1 of FIG. 4 and peripheral circuits according to the control sample.

The operation of the resistor including the MOS transistors M1 and M2 in the voltage comparator circuit of FIG. 4 is described below. FIG. 5 illustrates the configuration of an equivalent circuit of the MOS transistor M1 of FIG. 4 and peripheral circuits according to the present control sample. In other words, FIG. 5 illustrates the configuration of the MOS transistor M that is extracted as a part of the resistor of FIG. 4. Note that the MOS transistor M2 is connected to the MOS transistor M1 in parallel to compensate the bidirectional properties, and the MOS transistor M2 operates in a similar manner to the MOS transistor M1.

In FIG. 5, a current source 42 of current value I0 corresponds to the leakage current of the MOS transistor M1 of FIG. 4, and an input voltage source 41 of voltage Vin corresponds to the ground of FIG. 4. Moreover, the high-impedance input circuit 43 in FIG. 5 corresponds to the voltage comparator 33 in FIG. 4. As current or gate-source voltage Vgs is not externally supplied to the MOS transistor M1, the MOS transistor M1 is in an off state and operates within a weak inversion (subthreshold) region. The current value Isub in the weak inversion range is expressed in the following equation.

$$I\text{sub} = I\text{sub}_0 * \exp(Vgs/(\zeta * VT)) \quad (2)$$

In the Equation (2), $I\text{sub}_0$ indicates the saturation current at a MOS transistor within a weak inversion range. VT indicates thermal voltage which is calculated by k*T/q, and k indicates a Boltzmann constant. T indicates absolute temperature, and q indicates the amount of electric charge of electron. $\zeta$ indicates a weak inversion coefficient.

By differentiating the current value Isub with respect to the gate-source voltage Vgs, the inverse number of the current value Isub is obtained. The obtained inverse number is used as a resistance value Rsub of the MOS transistor M1. The resistance value Rsub is expressed in the following equation.

$$R\text{sub} = \zeta * VT / I\text{sub} \quad (3)$$

In the configuration of FIG. 5, Isub is leakage current which is in the order of a few pA in a semiconductor integrated circuit. Assuming that the leakage current Isub=10 pA, the weak inversion coefficient ζ is about 1.1, and the thermal voltage VT is 26 mV at room temperature. Due to this configuration, a high value is obtained for the resistance value Rsub, as in Rsub=2.86 GΩ.

However, the MOS transistor according to the present control sample is configured by a bulk wafer. For this reason, in addition to the leakage current as described above, the junction leakage current (substrate current) due to the PN junction develops on a semiconductor substrate. In other words, the electric current flowing through the drain of the MOS transistor M1 is equal to sum of the Isub and the substrate current, and the resistance value of the MOS transistor M1 becomes smaller than the resistance value Rsub. In view of the above circumstances, the MOS transistor formed on the SOI substrate is used as a resistor in the example embodiments of the present invention. By so doing, the substrate current is eliminated, and a resistor with an even higher resistance value is obtained compared with configuration according to the present control sample.

<Structural Difference Among MOS Transistors>

Figure 6A:
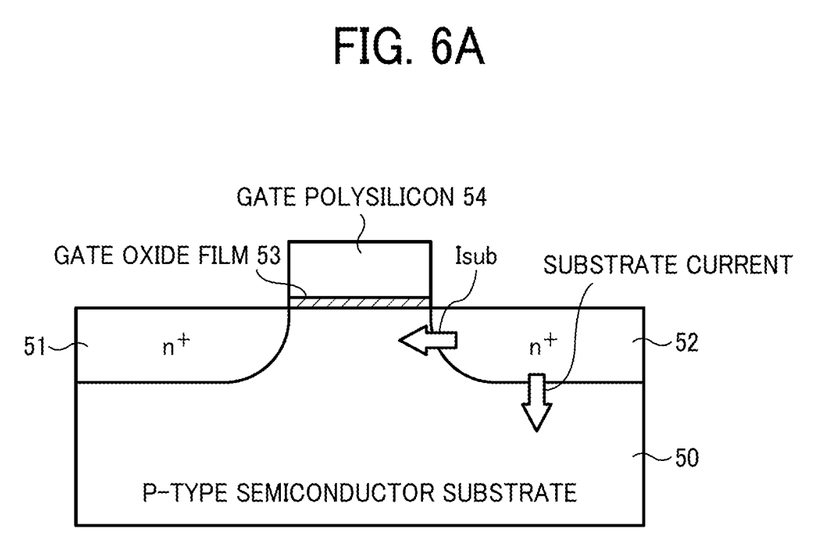
FIG. 6A is a longitudinal section of an N-channel MOS transistor that is formed on a bulk semiconductor wafer used in the control sample.
Figure 6B:
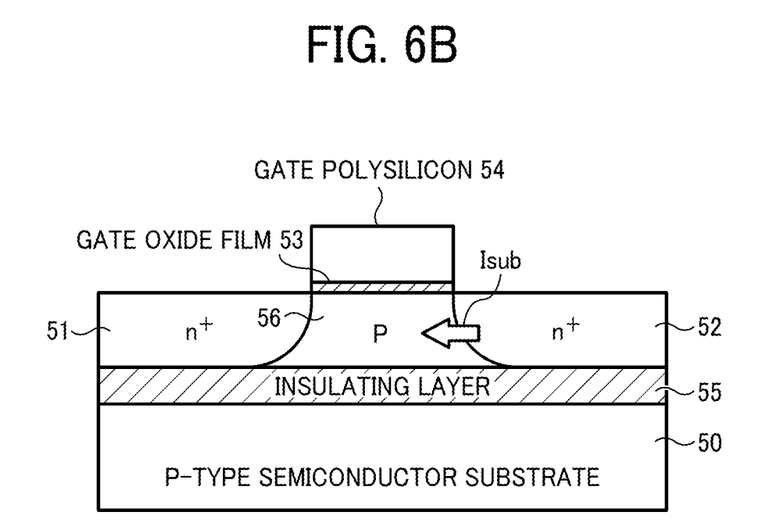
FIG. 6B is a longitudinal section of an N-channel MOS transistor that is formed on the SOI semiconductor wafer used in the present example embodiment of the present invention.

FIG. 6A is a longitudinal section of an N-channel MOS transistor that is formed on a bulk semiconductor wafer used in the control sample. FIG. 6B is a longitudinal section of an N-channel MOS transistor that is formed on the SOI semiconductor wafer used in the present example embodiment of the present invention. Structural differences between a MOS transistor with bulk structure and a MOS transistor with SOI structure are described below with reference to FIGS. 6A and 6B.

In the MOS transistor with bulk structure of FIG. 6A, n+ impurities are implanted into both sides of the gate of a p-type semiconductor substrate 50 that is arranged between the source and drain of the MOS transistor, and impurity regions 51 and 52 each of which is connected to the source and drain of the MOS transistor are formed. Then, a gate polysilicon 54 is formed on the p-type semiconductor substrate 50 having a gate oxide film 53 between the gate polysilicon 54 and the p-type semiconductor substrate 50. As a result, the gate of the MOS transistor is formed. Accordingly, not only the leakage current Isub of the MOS transistor but also the junction leakage current (substrate current) due to the PN junction flow from the impurity regions 51 and 52 to the p-type semiconductor substrate 50.

By contrast, in the MOS transistor with SOI structure as illustrated in FIG. 6B, an insulating layer 55 is inserted between the impurity regions 51 and 52 and the p-type semiconductor substrate 50, and thus the back gate of the MOS transistor is insulated from the p-type semiconductor substrate 50. Accordingly, there is no leakage current (substrate current) from the source or drain of the MOS transistor to the back gate of the MOS transistor. This configuration is applied to the configuration of the present example embodiment. More specifically, resistors 2, 2A, and 2B are configured by the PN junction diode 3 and 4 or the MOS transistors 6, 7, 8, and 9. By combining the resistors 2, 2A, and 2B with the capacitor 1, a high-pass filter circuit having very small cutoff frequency of, for example, 10 mHz, is achieved.

Fourth Embodiment

Figure 7:
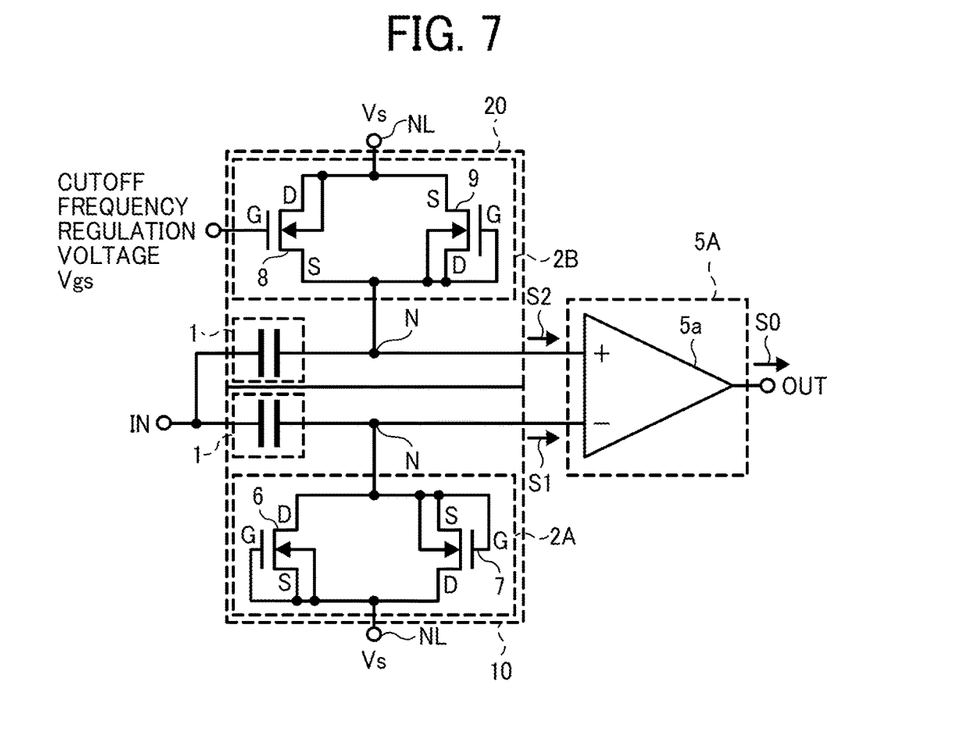
FIG. 7 illustrates the configuration of a band-pass filter circuit according to a fourth example embodiment of the present invention.

FIG. 7 illustrates the configuration of a band-pass filter circuit according to a fourth example embodiment of the present invention. The band-pass filter circuit according to the fourth example embodiment is provided with a first high-pass filter 10 including the capacitor 1 and the resistor 2A in the high-pass filter circuit according to the second example embodiment, a second high-pass filter 20 including the capacitor 1 and the resistor 2B in the high-pass filter circuit according to the third example embodiment, and a signal output circuit 5A including the operational amplifier 5a.

In FIG. 7, the first high-pass filter 10 and the second high-pass filter 20 cut off low frequency including a direct-current level of the signal input to the signal input terminal IN. The two signals S1 and S2 that have passed the high-pass filters 10 and 20 are input to the non-inverted input terminal and inverted input terminal of the operational amplifier 5a of the signal output circuit 5A.

The signal output circuit 5A configures a differential amplifier with the operational amplifier 5a of, for example, an amplification degree 1, and a signal 50 output from the signal output circuit 5A is expressed in the following equation.

$$S0 = S2 - S1 \quad (4)$$

Note that the values of the capacitance of the capacitors 1 of the high-pass filters 10 and 20 are equal to each other. Each one of the terminals of the resistors 2A and 2B of the high-pass filters 10 and 20 is connected to the low-impedance node NL that is set to a prescribed a bias voltage Vs using a constant-voltage generator. Moreover, a cutoff frequency regulation voltage Vgs to be applied to the gate of the third MOS transistor 8 is set to the resistor 2B of the second high-pass filter 20.

When the cutoff frequency regulation voltage Vgs is equal to the bias voltage Vs (Vgs=Vs), the first high-pass filter 10 and the second high-pass filter 20 have the same cutoff frequency characteristics, and the signal output from the signal output terminal is attenuated with reference to the input signal regardless of the frequency. The relationship among signals is expressed in the following equations.

$$S1 = S2 \quad (5)$$

$$S0 = 0 \quad (6)$$

Figure 8:
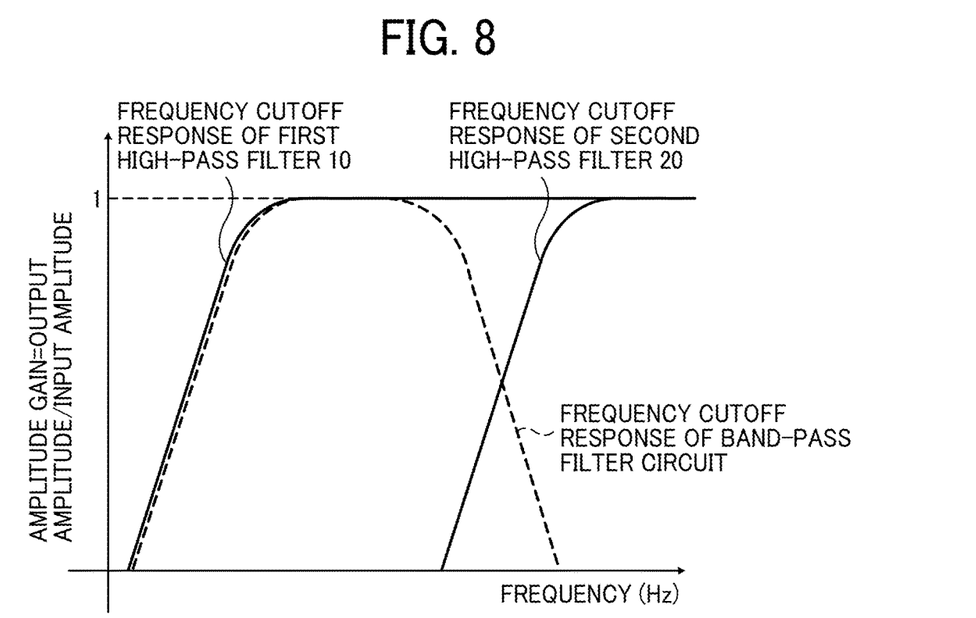
FIG. 8 is a graph of the frequency characteristics of the band-pass filter circuit of FIG. 7.

When the cutoff frequency regulation voltage Vgs is greater than the bias voltage Vs (Vgs>Vs), the gate-source voltage Vgs of the third MOS transistor 8 is no longer 0 V. Accordingly, the resistance value of the resistor 2B decreases. As a result, the cutoff frequency of the second high-pass filter 20 increases, and the output signals S1 and S2 output from the first and second high-pass filters 10 and 20 are different from each other (S1≠S2). Accordingly, the output signal 50 from the signal output circuit 5A indicates the frequency characteristics of band-pass filter as illustrated in FIG. 8. The pass-band width of the band-pass filter circuit in FIG. 8 is adjustable by the cutoff frequency regulation voltage Vgs.

If a circuit having a sampling signal or the like is added subsequent to the signal output circuit 5A, the noise of the sampling signal may be fed to the band-pass filter circuit and be superimposed on a signal component. In such cases, the impedance of the signal input terminal IN may be decreased by setting the cutoff frequency regulation voltage Vgs to around the threshold voltage of the third MOS transistor 8. Accordingly, the superimposition of the sampling noise can be reduced.

FIG. 8 is a graph of the frequency characteristics of the band-pass filter circuit of FIG. 7. As described above with reference to FIG. 7, the characteristics of the band-pass filter may be obtained by calculating a difference between the signal that has passed the first high-pass filter 10 and the signal that has passed the second high-pass filter 20, as illustrated in FIG. 8.

In the fourth example embodiment of FIG. 7, the inventors made a prototype of a circuit where the sizes of the MOS transistors 6, 7, 8, and 9 included in the high-pass filters 10 and 20 is "W/L=2 μm/1 μm" is formed on a silicon semiconductor substrate with the capacity of the capacitors 1 being 5 pF, and measured the cutoff frequency. As a result, the cutoff frequency was found to be 10 mHz. While the desired value of the first cutoff frequency in the present example embodiment is equal to or less than 1 Hz, a high-pass filter circuit with a cutoff frequency smaller than the desired value by two digits was achieved. In other words, according to the present example embodiment, a high-pass filter circuit with a cutoff frequency that has a sufficient margin with reference to the desired value cutoff frequency 1 Hz where the variations in elements are taken into consideration was achieved.

In the fourth example embodiment described above, the gate voltage of the third MOS transistor 8 as the cutoff frequency regulation voltage Vgs is changed such that the cutoff frequency characteristics of the two high-pass filters 10 and 20 are different from each other. Accordingly, the characteristics of the band-pass filter circuit of FIG. 8 is achieved. However, the present example embodiment is not limited to this configuration. The characteristics of the band-pass filter circuit of FIG. 8 may be achieved by changing the gate voltage of at least one of the MOS transistors 6, 7, 8, and 9 such that the cutoff frequency characteristics of the two high-pass filters 10 and 20 are different from each other.

<Modification>

Regarding the elements of the example embodiments described above, the resistors 2, 2A, and 2B are formed on an SOI semiconductor substrate, but the other elements may be formed as an external circuit.

Summary of Embodiments

A high-pass filter circuit according to a first mode includes a capacitor configured to input an input signal, a resistor connected between an output terminal of the capacitor and a prescribed bias voltage, and a signal output circuit connected to the output terminal of the capacitor and configured to buffer-amplify the input signal for output, where the resistor is formed on an SOI semiconductor substrate and includes two PN junction diodes that are inversely connected to each other in parallel, and the two PN junction diodes have an approximately zero potential difference between an anode and cathode of the PN junction diodes.

A high-pass filter circuit according to a second mode is characterized in that, in the high-pass filter circuit according to the first mode, the two PN junction diodes include first and second PN junction diodes, the cathode of the first PN junction diode and the anode of the second PN junction diode are connected to the output terminal of the capacitor, and the anode of the first PN junction diode and the cathode of the second PN junction diode are connected to the bias voltage.

A high-pass filter circuit according to a third mode includes a capacitor configured to input an input signal, a resistor connected between an output terminal of the capacitor and a prescribed bias voltage, and a signal output circuit connected to the output terminal of the capacitor and configured to buffer-amplify the input signal for output, where the resistor is formed on an SOI semiconductor substrate and includes two MOS transistors that are inversely connected to each other in parallel, and the two MOS transistors operate within a cutoff range.

A high-pass filter circuit according to a fourth mode is characterized in that, in the high-pass filter circuit according to the third mode, the two MOS transistors include first and second N-channel MOS transistors, a drain of the first MOS transistor and a gate, source, and back gate of the second MOS transistor are connected to the output terminal of the capacitor, and a gate, source, and back gate of the first MOS transistor and a drain of the second MOS transistor are connected to the bias voltage.

A high-pass filter circuit according to a fifth mode is characterized in that, in the high-pass filter circuit according to the third mode, the two MOS transistors include third and fourth P-channel MOS transistors, a gate, source, and back gate of the third MOS transistor and a drain of the fourth MOS transistor are connected to the output terminal of the capacitor, and a drain of the third MOS transistor and a gate, source, and back gate of the fourth MOS transistor are connected to the bias voltage.

A band-pass filter circuit according to a sixth mode includes the high-pass filter circuit according to the fourth model as a first high-pass filter circuit, the high-pass filter circuit according to the fifth model as a second high-pass filter circuit, where the second high-pass filter circuit has a frequency characteristic different from that of the first high-pass filter circuit, and a signal output circuit configured to generate and output a differential signal between a signal output from the first high-pass filter circuit and a signal output from the second high-pass filter circuit.

A band-pass filter circuit according to a seventh mode is characterized in that, in the band-pass filter circuit according to the sixth mode, gate voltage of at least one of the first, second, third, and fourth MOS transistors of the first and second high-pass filter circuits is changed such that a frequency characteristic of the first high-pass filter circuit is different from a frequency characteristic of the second high-pass filter circuit.

According to the example embodiments described above, at least resistors of a semiconductor integrated circuit are formed on an SOI substrate, and a parasitic diode does not appear unlike a known configuration in which elements of a semiconductor integrated circuit are formed on a bulk substrate. Moreover, the resistance value becomes high as the potential difference between the anode and cathode of PN junction diodes is made approximately zero. Accordingly, the cutoff frequency may be reduced to 10 mHz without increasing the area of circuit and providing any external component.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A high-pass filter circuit comprising:
   a capacitor configured to input an input signal;
   a signal output circuit including an operational amplifier having a non-inverting input connected to an output terminal of the capacitor, to buffer-amplify the input signal to output a high pass filtered signal; and
   a resistor connected (i) between the output terminal of the capacitor and a prescribed non-zero bias voltage and (ii) between the non-inverting input of the operational amplifier and the prescribed bias voltage, wherein the resistor is formed on an SOI semiconductor substrate and includes two PN junction diodes that are inversely connected to each other in parallel, the two PN junction diodes have an approximately zero potential difference between an anode and cathode of the PN junction diodes, and the two PN junction diodes set a bias point of the non-inverting input of the operational amplifier to the prescribed non-zero bias voltage to provide the high pass filtered signal with a very low cutoff frequency.

2. The high-pass filter circuit according to claim 1, wherein the two PN junction diodes include a first PN junction diode and a second PN junction diode, the cathode of the first PN junction diode and the anode of the second PN junction diode are connected to the output terminal of the capacitor, and the anode of the first PN junction diode and the cathode of the second PN junction diode are connected to the bias voltage.

3. The high-pass filter circuit according to claim 1, wherein the operational amplifier of the signal output circuit further includes an inverting input connected to an output of the operational amplifier, and each of the two PN junction diodes is connected to the non-inverting input of the operational amplifier.

4. The high-pass filter circuit according to claim 1, wherein the operational amplifier of the signal output circuit further includes an inverting input connected to an output of the operational amplifier, and each of the two MOS transistors is connected to the non-inverting input of the operational amplifier.

5. The high-pass filter circuit according to claim 1, wherein the high-pass filter circuit is configured to cutoff low frequency components of an input signal which are below a predetermined cutoff frequency of the high-pass filter circuit and to pass high frequency components of the input signal which are above the predetermined cutoff frequency.

6. A high-pass filter circuit comprising:
a capacitor configured to input an input signal;
a signal output circuit including an operational amplifier having a non-inverting input connected to an output terminal of the capacitor, to buffer-amplify the input signal to output a high pass filtered signal; and
a resistor connected (i) between the output terminal of the capacitor and a prescribed non-zero bias voltage and (ii) between the non-inverting input of the operational amplifier and the prescribed bias voltage,
wherein the resistor is formed on an SOI semiconductor substrate and includes two MOS transistors that are inversely connected to each other in parallel, the two MOS transistors operate within a cutoff range in which current at each drain of the two MOS transistors is approximately zero, and the two MOS transistors set a bias point of the non-inverting input of the operational amplifier to the prescribed non-zero bias voltage to provide the high pass filtered signal with a very low cutoff frequency.

7. The high-pass filter circuit according to claim 6, wherein the two MOS transistors include a first N-channel MOS transistor and a second N-channel MOS transistor, a drain of the first MOS transistor and a gate, source, and back gate of the second MOS transistor are connected to the output terminal of the capacitor, and a gate, source, and back gate of the first MOS transistor and a drain of the second MOS transistor are connected to the bias voltage.

8. The high-pass filter circuit according to claim 6, wherein the two MOS transistors include a third P-channel MOS transistor and a fourth P-channel MOS transistor, a gate, source, and back gate of the third MOS transistor and a drain of the fourth MOS transistor are connected to the output terminal of the capacitor, and a drain of the third MOS transistor and a gate, source, and back gate of the fourth MOS transistor are connected to the bias voltage.

* * * * *